US007931249B2

(12) United States Patent
Schultz

(10) Patent No.: US 7,931,249 B2
(45) Date of Patent: Apr. 26, 2011

(54) REDUCED FRICTION MOLDS FOR INJECTION MOLDED SOLDER PROCESSING

(75) Inventor: Mark D. Schultz, Ossining, NY (US)

(73) Assignee: International Business Machines Corporation, Armonk, NY (US)

(*) Notice: Subject to any disclaimer, the term of this patent is extended or adjusted under 35 U.S.C. 154(b) by 698 days.

(21) Appl. No.: 11/670,080

(22) Filed: Feb. 1, 2007

(65) Prior Publication Data

US 2008/0185118 A1     Aug. 7, 2008

(51) Int. Cl.
*B22D 11/00* (2006.01)
*H05K 3/00* (2006.01)
*H01L 21/00* (2006.01)

(52) U.S. Cl. .......... 249/115; 249/119; 249/120; 164/14; 164/267; 164/268; 427/133; 427/165; 264/2.5; 264/219; 228/180.22; 228/254

(58) Field of Classification Search .................. 249/105, 249/110, 114.1–116, 119, 120, 134, 135; 425/542, 547, 585, 586, 588, 112, 121, 129.1, 425/130, 121.1, 434; 228/227, 232, 233.2, 228/234.1, 244–247, 254, 180.22; 164/7.1, 164/9, 14, 15, 519, 471, 72, 118, 133, 267, 164/271, 437, 439.29, 338.1, 350, 268, 472; 438/108, 613, 616, 694, 715, 716, 720; 427/133–135, 165; 264/2.5, 219
See application file for complete search history.

(56) References Cited

U.S. PATENT DOCUMENTS

| 2,564,308 | A | * | 8/1951 | Nagel ........................... 427/133 |
| 3,023,119 | A | * | 2/1962 | Anderson et al. ............. 428/330 |
| 3,635,510 | A | * | 1/1972 | Stoller et al. .................. 428/428 |
| 3,880,684 | A | * | 4/1975 | Abe ............................... 438/713 |
| 4,550,761 | A | * | 11/1985 | Moore ........................... 164/14 |
| 5,690,841 | A | * | 11/1997 | Elderstig ........................ 216/39 |
| 5,717,477 | A | * | 2/1998 | Fritz et al. ..................... 349/151 |
| 5,718,367 | A | * | 2/1998 | Covell et al. .................. 228/254 |
| 6,029,882 | A | * | 2/2000 | Bolde et al. ................... 228/254 |
| 6,527,158 | B1 | * | 3/2003 | Brouillette et al. ............ 228/33 |
| 6,548,453 | B1 | * | 4/2003 | Narasimhan et al. ......... 508/106 |
| 6,602,791 | B2 | * | 8/2003 | Ouellet et al. ................ 438/696 |
| 7,157,364 | B2 | * | 1/2007 | Akram ........................... 438/614 |

FOREIGN PATENT DOCUMENTS

CN     1594152 A     3/2005

* cited by examiner

*Primary Examiner* — Joseph S Del Sole
*Assistant Examiner* — Dimple Bodawala
(74) *Attorney, Agent, or Firm* — Gail Zarick, Esq.; Scully, Scott, Murphy & Presser, P.C.

(57) ABSTRACT

A process of reducing friction, which is encountered in molds utilized in injection molded, solder processing, and wherein glass mold plates have mold pits etched therein. The mold pates are subjected to a heat treatment so as to smooth or round-off sharp edges along the periphery of the mold pits.

10 Claims, 1 Drawing Sheet

POST HEAT TREATMENT

US 7,931,249 B2

REDUCED FRICTION MOLDS FOR INJECTION MOLDED SOLDER PROCESSING

BACKGROUND OF THE INVENTION

1. Field of the Invention

The present invention relates to a process of reducing friction, which is encountered in molds utilized in injection molded solder processing.

2. Background Art

In the fabrication of mold plates, which are utilized for purposes of injection molded solder processes, particularly those employed to produce semiconductor chip connection processes, for instance, such as for the controlled collapse chip connect new process (C4NP), the normally glass material mold plates are generally produced utilizing an etching process which causes the surface of the mold plates to be provided with mold pits or cavities. These etched mold pits in the mold plate surfaces are frequently encountered in possessing sharp edges, whereby the sharp edges have a tendency to abrade the mold fill head o-rings of the mold apparatus. This may cause debris from the o-rings to be located on or embedded in the mold plate, which is equipped with pits or cavities to be filled with solder in order to produce the solder connections. Consequently, this presence of the sharp pit edges may result in defects in the components and operation of the molding apparatus, and in a reduced service life for the o-rings due to excessive wear during the employment thereof.

Moreover, the abrasive phenomenon which is encountered through the presence of the sharp edges of the etched pits in the surface of the mold plates, may also lead to an increase in friction forces opposing the motion of the mold plates during operation of the molding apparatus, potentially producing a reduction in operating margins or efficiency caused by a twisting of the fill head while dispensing the solder into the cavities which are to be filled therewith. Moreover, the resultant increase in friction may also generate debris deposited on the mold plate surface, which emanates from the fill head seal of the apparatus, thereby rendering the mold filling process subject to considerable difficulties.

Generally, as indicated, the mold plates may be constituted of a material such as glass, the property of which may be considered as constituting a "solid liquid" in the technology, and which, at elevated temperatures, acts in many instances like any other liquid, with forces due to surface tension, viscosity and interaction with neighboring materials comprising a determining in its behavior and characteristic.

In this instance, surface tension forces may possess a tendency to soften any sharp edges in the pits, which have been formed in the surface of the glass mold plates, and whereby an increase in the temperature to levels at which these forces can overcome the viscosity over a period of time at elevated temperatures may tend to smooth or round off the sharp edges of the mold pits.

SUMMARY OF THE INVENTION

Accordingly, in order to alleviate the problems which are encountered in the presence of sharp edges in mold pits on the mold plate surface, the edges of the mold pits can be radiused or smoothed and resultingly rounded off through the intermediary of a heat treatment imparted to the glass mold plate at a temperature which is sufficiently high and over a sufficient duration of so as to enable the surface tension forces in a glass material which approaches a "near melting" or lowered viscosity condition to soften the sharp edges of the mold edge pits without substantially affecting the overall shape and volume of the mold pits. Some minor degree of alteration in shape and/or volume may be encountered, but can be precedingly compensated for during the etching of the mold pits.

Alternatively, some type of a mechanical polishing process with a compliant backing and polishing compound may be another method employed in accomplishing the smoothing of the pit edges, but may be somewhat more difficult to control and be more expensive in the implementation thereof than the process of heat treating the glass mold plate, as proposed by the present invention. Moreover, it may also be possible to utilize a surface, rather than a bulk or through-extending heat treatment, in effect, treating only the surface of the mold plate, rather than the entire thickness thereof, but this may involve an increase in stresses and difficulties in controlling the pit edge smoothing or radiusing process. Consequently, a bulk heat treatment process may be more advantageous in reducing surface texture of the glass mold plate, and thereby further reducing friction attributable to the flat areas of the glass mold plate material.

In order to attain the foregoing pit edge smoothing effect, it may be advantageous to increase the temperature of the glass mold plate up to a range of approximately 760° C., in essence, approximately 60° C. below the "softening" temperature of glass material, and to then reduce the temperature over a period of time, whereby this maximum temperature level, although well above the "annealing" temperature of the glass, may be designated as a "heat-treatment", rather than an annealing of the glass, per se.

Furthermore, other aspects may be considered in identifying the optimum heat treating time and temperature profile imparted to the glass mold plate in order to appropriately soften the mold pit edges, whereby possibly two kinds of substrate coatings, such as graphite and a refractory kiln wash on a substrate on which the glass plate is mounted, may be considered in addressing the problem of mold sticking to a substrate on which it is heat treated.

Possibly, particularly if a graphite substrate is to be employed, it may be desirable to control the heat-treatment environment in order to restrict the presence of oxygen. Another approach may be to coat a substrate or the back surface of the mold plate with a sacrificial or possibly permanent layer in order to prevent sticking between the components. An oxide or nitride possessing a sufficient temperature stability may also be employed, whereby if the coating layer is to be permanent, in essence, not sacrificial to require being removed subsequent to treatment, the coating layer may be applied to the backside of the mold plate, rather than to the substrate.

A substrate, which is adapted to be utilized in order to support the backside of the glass mold plate, may have to be flat and stable throughout the temperature cycle which is imparted to the mold plate, and whereby a material choice among other suitable materials may be that of quartz. There may also be provided a stable substrate material, which the glass mold plate will not adhere to at elevated temperatures, and moreover, lengthier time intervals at lower heat treatment temperatures may possibly mitigate sticking between the substrate and the glass mold plate being treated while maintaining the desired mold plate pit edge modifications.

In essence, during the heat-treatment of the glass mold plate, the underlying substrate must be of an essentially completely or precisely flat or panel configuration, inasmuch as treatments that are implemented when the substrates are not acceptably flat or planar, may produce unacceptably deformed mold pit configurations.

Necessarily, the substrate is required to be stable in both of its mechanical and chemical characteristics under extremely large temperature ramping cycles, whereby as indicated, a material such as quartz for the substrate may be an acceptable choice.

In as much as elevated temperatures cause other liquid aspects to come into consideration or play, in particular, such as "wetting" or its equivalent, an initial experimentation with a mold plate located on a quartz substrate resulted in the mold plate sticking to the substrate and possibly damaging both the mold plate and the substrate, requiring that a further investigation be made that the temperature ramping up and ramping down process or cycling may not be a well-controlled aspect and exact time at the treatment temperature can vary significantly so as to render an issue the consideration of uniformities and temperature and duration of time across a large surfaced mold plate utilizing such an approach.

BRIEF DESCRIPTION OF THE DRAWINGS

Reference may now be made to the following detailed description of a preferred embodiment of the invention in the effectuating heat treatment of glass mold plates having mold pits or cavities etched therein, wherein.

DETAILED DESCRIPTION OF THE INVENTION

Figures 1A, 2A:
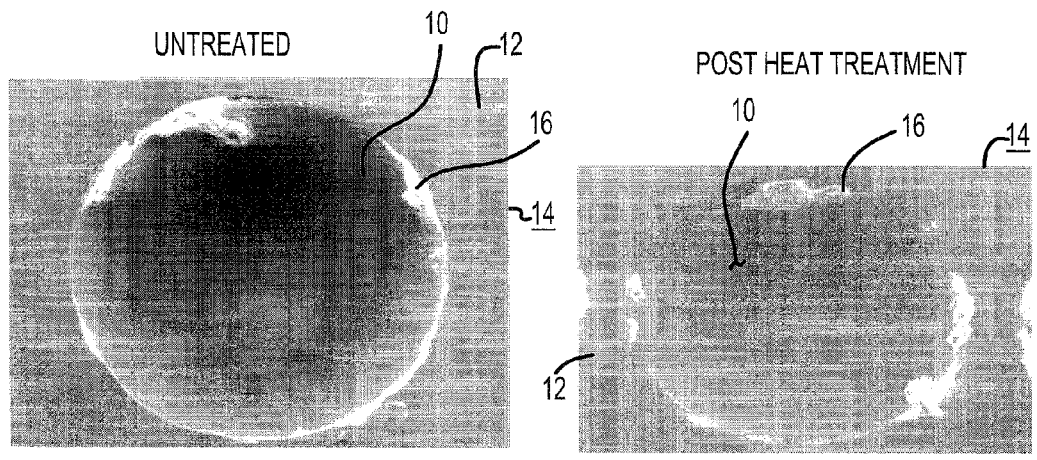
FIGS. 1A and 1B illustrate, respectively, plan and side spectroscopic views of a mold plate pit in an initially untreated configuration.
FIGS. 2A and 2B illustrate, respectively, plan and side spectroscopic views of the mold plate pit in a post heat-treatment stage.
Figures 1B, 2B:
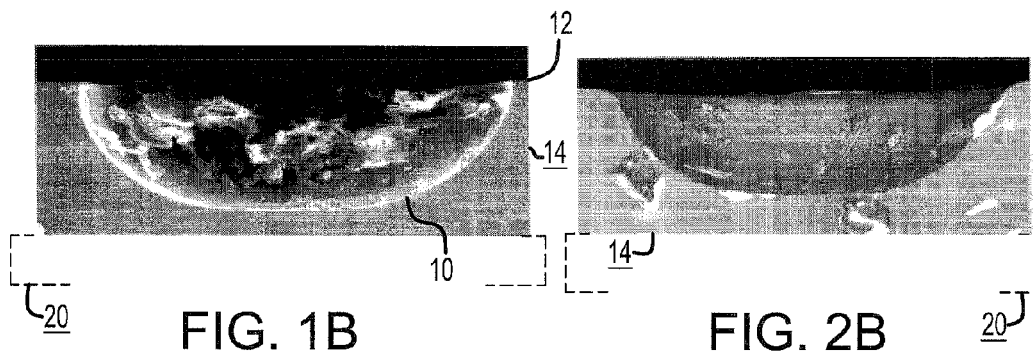

Referring to FIGS. 1A and 1B of the drawings, there is spectroscopically illustrated a typical pit or cavity 10, which has been etched into the upper surface 12 of a glass mold plate 14, and which shows the peripheral edge 16 of the pit having a relatively sharp configuration at the meeting location with the plate surface, which can readily cause undue damage to be sustained by o-rings of the apparatus and adversely affect the operation of the molding apparatus, such as be a deposition of debris and particulate contaminants of the mold plate surface and in the mold cavities. Moreover, the sharp edge 16 of the mold pit 10 may result in a shortened service life for the o-ring and also adversely affect the functioning of the fill head of the mold apparatus.

As illustrated in FIGS. 2A and 2B of the drawings, wherein the glass mold plate 14 has been heat-treated at the temperatures such as from about 740° C. to about 800° C. for a predetermined period of time, preferably within about 1 minute to about 20 minutes. In that instance, the peripheral edge 16 of the mold pit 10 in the surface 12 of the glass mold plate 14 has been radiused and shown to be in a smoother rounded-off configuration, thereby reducing or eliminating the sharpness of the edge, so as to have a reduced tendency to adversely affect the process of injection molded soldering for which the glass mold plate 14 is employed. Further experiments indicate that in one useful case, the borosilicate glass mold plate is heated to 760° C. and held there for 10 minutes before being allowed to cool.

Quite evidently, the heat-treatment of the glass mold plate 14 will successfully increase the pit smoothing at the edge 16 thereof, with no significant alteration of mold pit or cavity volume. Moreover, utilizing suitable material for a flat or planar substrate 20 on which the glass mold plate 14 is mounted will also enable the heat-treatment to be implemented without any adverse effect on the planarity and quality of the upper mold plate surface 12. Other substrate materials besides quartz, such as graphite plates, may also be successfully employed, as well as different temperature and time cycles for the heat treatment. Moreover, a coating of materials may also be utilized, such as a graphite powder, and other materials, which are being investigated. This may provide a solution to the "sticking" problem between the mold plate and substrate, which has been encountered to some extent in connection with the foregoing process. Best results have been obtained utilizing a refectory kiln wash such as "AMACO Kiln Wash."

Figure 3:
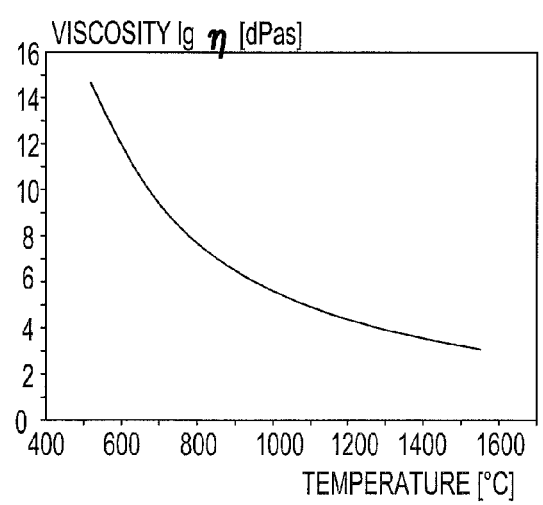
FIG. 3 illustrates a graphical representation of a process window work in progress.

As illustrated in FIG. 3 of the drawings, showing a graphical representation of viscosity versus temperature and degrees in centigrade, a treatment at lower temperatures with a controlled dwelling time period may provide for a more manufacturing-friendly process work window in the treatment of the glass mold plate, in order to reduce the sharp edges of the mold pits, and wherein this aspect may be predicated on different factors depending upon the types of materials being employed.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but to fall within the spirit and scope of the appended claims.

What is claimed is:

1. A method of modifying glass material mold plates having upper surfaces, wherein mold pits are etched in the upper surfaces of said mold plates, said mold pits having initially sharp peripheral edges; said mold plates being utilized in implementing injection molded solder processing, said method comprising:

wherein said mold plates are subjected in at least the upper surface regions thereof to a heat treatment so as to cause the initially sharp peripheral edge of each of said mold pits to deform into said rounded-off or smoothly radiused configuration extending into said upper surfaces of the mold plates;

wherein said mold plates have backside surfaces thereof supported on a substrate having a planar surface in contact therewith during at least the heat treatment of said glass material mold plates; and wherein the planar surface area of said substrate and the backside surfaces of said mold plates have a coating layer of a material interposed so as to inhibit sticking between said mold plates and said substrate; said coating layer being selected from the group of materials consisting of graphite, and a refectory kiln wash.

2. A method as claimed in claim 1, wherein said heat treatment of said mold plates is implemented throughout the thickness of each of said mold plates.

3. A method as claimed in claim 1, wherein said heat treatment comprises heating said glass material mold plates to a temperature which is below a softening temperature of said glass material.

4. A method as claimed in claim 3, wherein said glass material mold plates are heated to a temperature at approximately 60° C. below the softening temperature of said glass material.

5. A method as claimed in claim 1, wherein said heat treatment comprises heating said glass material mold plates to a temperature of about 760° C.

6. A method as claimed in claim 3, wherein said heat treatment of the glass material mold plates is maintained over a duration of about 10 minutes.

7. A method as claimed in claim 1, wherein said substrate is constituted of quartz.

8. A method as claimed in claim 1, wherein said substrate is constituted of graphite plate.

9. A method as claimed in claim 1, wherein said coating layer is permanently applied to the lower surface of said mold plates.

10. A method as claimed in claim 1, wherein said coating layer comprises a sacrificial layer of material which is temporarily applied to the surface of said substrate for the duration of the heat treatment of the mold plates.

* * * * *